United States Patent
Carberry

(10) Patent No.: US 9,543,493 B2
(45) Date of Patent: Jan. 10, 2017

(54) PACKAGING FOR THERMOELECTRIC SUBCOMPONENTS

(71) Applicant: Mossey Creek Technologies Inc., Jefferson City, TN (US)

(72) Inventor: John Carberry, Talbott, TN (US)

(73) Assignee: Mossey Creek Technologies, Inc., Jefferson City, TN (US)

( * ) Notice: Subject to any disclaimer, the term of this patent is extended or adjusted under 35 U.S.C. 154(b) by 802 days.

(21) Appl. No.: 13/683,659

(22) Filed: Nov. 21, 2012

(65) Prior Publication Data

US 2013/0125949 A1 May 23, 2013

Related U.S. Application Data

(60) Provisional application No. 61/562,790, filed on Nov. 22, 2011, provisional application No. 61/563,249, filed on Nov. 23, 2011.

(51) Int. Cl.
*H01L 35/32* (2006.01)
*H01L 35/14* (2006.01)
*H01L 35/22* (2006.01)

(52) U.S. Cl.
CPC .............. *H01L 35/32* (2013.01); *H01L 35/14* (2013.01); *H01L 35/22* (2013.01)

(58) Field of Classification Search
CPC ................................. H01L 35/04; H01L 35/22
USPC ......................................................... 136/205
See application file for complete search history.

(56) References Cited

U.S. PATENT DOCUMENTS 4,624,862 A 11/1986 Yang et al.
4,803,183 A 2/1989 Schwetz et al.
4,877,759 A 10/1989 Holt
4,908,173 A 3/1990 Schwetz et al.
5,049,367 A 9/1991 Nakano et al.
(Continued)

FOREIGN PATENT DOCUMENTS

CN 101244823 8/2008
JP 11-54805 2/1999
(Continued)

OTHER PUBLICATIONS

D.M. Rowe, CRC Handbook of Thermoelectrics, 1995, pp. 330-331.*
https://en.wikipedia.org/wiki/Borosilicate_glass, accessed Jun. 25, 2015.*
D. Wagner, Point Defects in Crystalline and Amorphous Silicon, Journal of Optoelectronics and Advanced Materials, vol. 6, No. 1, March 2004, pp. 345-347.
(Continued)

*Primary Examiner* — Shannon Gardner
(74) *Attorney, Agent, or Firm* — Pitts & Lake, P.C.

(57) ABSTRACT

A thermoelectric semiconducting assembly. Two parallel plates, a first plate and a second plate, are spaced apart. A plurality of pellets are fitted into said first plate and into said second plate, each said pellet comprising a body, a first cap, and a second cap, said body including a silicon material, said first cap and said second cap including an electrically resistive ceramic material, each pellet in said second plate being connected to a pellet in said first plate. Each pellet includes a doped body, wherein half of said pellets are doped with a p-type dopant to form a p-type pellet and half of said pellets are doped with an n-type dopant to form an n-type pellet. Each plate includes p-type pellets and n-type pellets in an alternating pattern, and each p-type pellet in said first plate connects with an n-type pellet in said second plate, and wherein each n-type pellet in said first plate connects with a p-type pellet in said second plate.

16 Claims, 3 Drawing Sheets

(56) References Cited

U.S. PATENT DOCUMENTS

| | | | |
|---|---|---|---|
| 5,165,983 A | 11/1992 | Sugiura et al. | |
| 5,209,786 A * | 5/1993 | Rolfe et al. | 136/211 |
| 5,427,601 A | 6/1995 | Harada et al. | |
| 5,431,869 A | 7/1995 | Kumar et al. | |
| 5,654,246 A | 8/1997 | Newkirk et al. | |
| 6,013,236 A | 1/2000 | Takahashi et al. | |
| 6,902,699 B2 | 6/2005 | Fritzmeier et al. | |
| 7,344,675 B2 | 3/2008 | Van Daam et al. | |
| 7,354,490 B2 | 4/2008 | Fritzmeier et al. | |
| 7,604,696 B2 | 10/2009 | Carberry | |
| 7,922,841 B2 | 4/2011 | Bampton | |
| 2002/0125402 A1 | 9/2002 | Cordes et al. | |
| 2004/0048411 A1 | 3/2004 | Nishida | |
| 2005/0145176 A1 | 7/2005 | Wicker | |
| 2005/0150538 A1* | 7/2005 | Liu et al. | 136/205 |
| 2006/0142143 A1 | 6/2006 | Abrevaya et al. | |
| 2008/0153688 A1 | 6/2008 | Borens et al. | |
| 2008/0233720 A1 | 9/2008 | Carberry | |
| 2009/0120493 A1 | 5/2009 | Sinha | |
| 2009/0191112 A1 | 7/2009 | Moon et al. | |
| 2009/0250103 A1 | 10/2009 | Katoh et al. | |
| 2010/0059107 A1 | 3/2010 | Barnett et al. | |
| 2010/0084776 A1 | 4/2010 | Murozono et al. | |

FOREIGN PATENT DOCUMENTS

| | | |
|---|---|---|
| WO | WO2004055909 | 7/2004 |
| WO | WO2006107769 | 10/2006 |
| WO | WO 2010/092972 | 8/2010 |
| WO | WO 2012/033303 | 3/2012 |
| WO | WO 2012/067327 | 5/2012 |

OTHER PUBLICATIONS

Faiz Salleh, Kiyosumi Asai, Akihiro Ishida, and Hiroya Ikeda,Seebeck Coefficient of Ultrathin Silicon-on-Insulator Layers, 2009 The Japan Society of Applied Physics, Appl. Ph.

John B. Butt, Thermal Conductivity of Porous Catalyst, A.I.Ch.E. Journal, Jan. 1965, vol. 11, No. 1, pp. 106-112.

* cited by examiner

PACKAGING FOR THERMOELECTRIC SUBCOMPONENTS

CROSS-REFERENCE TO RELATED APPLICATIONS

This Application claims the benefit under 35 U.S.C. section 119(e) of U.S. Provisional Patent Application No. 61/562,790, filed Nov. 22, 2011, and claims the benefit under 35 U.S.C. section 119(e) of U.S. Provisional Patent Application No. 61/563,249, filed Nov. 23, 2011, and claims the benefit under 35 U.S.C. section 119(e) of U.S. Provisional Patent Application No. 61/577,487, filed Dec. 19, 2011. The contents of U.S. Provisional Patent Application No. 61/562,790, U.S. Provisional Patent Application No. 61/563,249, and U.S. Provisional Patent Application No. 61/577,487 are herein incorporated in their entireties by reference.

FIELD OF INVENTION

The present general inventive concept relates to the preparation and use of thermoelectric materials and more particularly to methods and processes to fabricate silicon-based semiconductive materials to use in the production of electricity from recovered waste heat.

BACKGROUND

Semiconductive materials that exhibit the Seebeck effect in the presence of a temperature gradient are useful for the production of electricity from waste heat as well as to input electricity to move heat from one side to effect cooling. The class of semiconductive materials exhibiting the Seebeck effect is hereinafter called thermoelectrics or thermoelectric materials.

A number of contemporary thermoelectrics comprise alternating p-type and n-type semiconductor elements connected by metallic connectors. Many contemporary thermoelectrics present various disadvantages, including, in some instances, high material costs, high costs of production, difficulty of manufacture, the use of rare elements, the use of potentially carcinogenic or toxic substances, and limited formability as well as operating temperature limitations and very high coefficient of thermal expansion.

The Seebeck coefficient (S) of a material is a measurement of the magnitude of an induced thermoelectric voltage in response to a temperature difference across that material. Optimally, a highly efficient thermoelectric material should have a high Seebeck coefficient, high electrical conductivity, and low thermal conductivity and be able to operate at high temperatures, meaning it should have a low coefficient of thermal expansion. Other considerations arise as well. It is desirable that a thermoelectric material be susceptible to being worked to construct planar and complex net-shaped objects that can be fitted into locations where they may be used to recover waste heat. Such a thermoelectric material should have a cross section with properties to maintain a sufficiently high temperature differential between the two opposing sides in order to generate voltage efficiently. It is also desirable that a thermoelectric material have high tensile strength, have resistance to thermal shock, meaning strength and low coefficient of thermal expansion, and be formable into layers to allow the creation of graded indices for electrical, thermal, or other parameters—allowing one thermoelectric material to serve as the basis for a range of thermoelectric devices.

Silicon metal is of important value in certain chemical applications as a feedstock and/or feedstock precursor in products such as glass, silicone, silanes and many other materials. In virtually all cases, the state of the silicon to be introduced includes small particle sizes, in the range of microns or nanometers, narrow particle size distribution, and a surface substantially or completely free of oxygen, water, compounds having hydroxyl groups, or other oxidative groups. Providing small particle sizes of metallic silicon particulates with surfaces substantially or completely free of oxidative groups is important to use quantum size effects associated with silicon nanostructures to reduce the thermal conductivity of the silicon by two orders of magnitude and keeping oxide free to effect very high electrical conductivity, as well as for improving the efficiency, yield, and quality, while reducing the costs of producing high quality optical glasses, silicon based computer chips, and other products utilizing silicon based materials.

SUMMARY

In some embodiments of the present general inventive concept, a thermoelectric semiconducting assembly for use in generating electricity from waste heat in industrial settings or using electricity to effect cooling comprises: a first plate and a second plate, said first plate and said second plate being parallel and being spaced apart, said plates being fabricated from an electrically insulating material; a plurality of semiconductor components fitted into said first plate, said semiconductor components including a material including silicon; and a plurality of semiconductor components fitted into said second plate, said semiconductor components including a material including silicon, each said semiconductor component in said second plate being connected to a semiconductor component in said first plate.

In some embodiments, each semiconductor component includes a doped body, wherein half of said semiconductor components are doped with a p-type dopant to form a p-type constituent and half of said semiconductor components are doped with an n-type dopant to form an n-type constituent, wherein said first plate includes p-type constituents and n-type constituents in an alternating pattern, wherein said second plate includes p-type constituents and n-type constituents in an alternating pattern, wherein each p-type constituent in said first plate connects with an n-type constituent in said second plate, and wherein each n-type constituent in said first plate connects with a p-type constituent in said second plate. In some embodiments, said p-type dopant includes boron, aluminum, gallium, indium, or thallium. In some embodiments, said n-type dopant includes phosphorus, arsenic, antimony, bismuth, selenium, or tellurium. In some embodiments, said p-type dopant includes boron and said n-type dopant includes arsenic.

In some embodiments, a thermoelectric semiconducting assembly comprises: a first plate and a second plate, said first plate and said second plate being parallel and being spaced apart, said first plate having an exterior surface and an interior surface, said second plate having an exterior surface and an interior surface, said interior surface of said first plate facing said interior surface of said second plate, said plates being fabricated from a glass material; a plurality of pellets fitted into said first plate, each said pellet comprising a body, a first cap, and a second cap, said body including a silicon material, said first cap and said second cap including an electrically resistive ceramic material, said pellets fitted into said first plate such that said first cap of said pellet is oriented toward said exterior surface of said first plate and said second cap of said pellet is oriented toward said interior surface of said first plate and protrudes from said interior surface of said first plate; and a plurality of pellets fitted into said second plate, each said pellet comprising a body, a first cap, and a second cap, said body including a silicon material, said first cap and said second cap including an electrically resistive ceramic material, said pellets fitted into said second plate such that said first cap of said pellet is oriented toward said exterior surface of said second plate and said second cap of said pellet is oriented toward said interior surface of said second plate and protrudes from said interior surface of said second plate, each said pellet in said second plate being connected to a pellet in said first plate.

In some embodiments, each pellet includes a doped body, wherein half of said pellets are doped with a p-type dopant to form a p-type pellet and half of said pellets are doped with an n-type dopant to form an n-type pellet, wherein said first plate includes p-type pellets and n-type pellets in an alternating pattern, wherein said second plate includes p-type pellets and n-type pellets in an alternating pattern, wherein each p-type pellet in said first plate connects with an n-type pellet in said second plate, and wherein each n-type pellet in said first plate connects with a p-type pellet in said second plate. In some embodiments, said p-type dopant includes boron, aluminum, gallium, indium, or thallium. In some embodiments, said n-type dopant includes phosphorus, arsenic, antimony, bismuth, selenium, or tellurium. In some embodiments, said p-type dopant includes boron and said n-type dopant includes arsenic. In some embodiments, said first cap includes aluminum nitride or beryllium oxide. In some embodiments, said first cap includes powderized tungsten infiltrated with copper. In some embodiments, said first cap includes nickel. In some embodiments, said first cap includes an alloy of nickel, iron, and cobalt.

In some embodiments, said pellets are fitted into said first plate and said second plate by brazing. In some embodiments, said pellets are fitted into said first plate and said second plate by soldering. In some embodiments, said pellets are fitted into said first plate and said second plate with glass fritting. In some embodiments, said pellets are fitted into said first plate and said second plate by mechanical means.

In some embodiments, said first plate and said second plate include boro-silicate glass.

In some embodiments of the present general inventive concept, a pellet for use in a thermoelectric material comprises: a body including a silicon material, said body defining at least two opposing sides; and a cap material including an electrically resistive material; said pellet including two caps fabricated from said cap material, each said cap connected to said body on one of said two opposing sides of said body. In some embodiments, said pellet is doped with a doping material. In some embodiments, said dopant includes boron, aluminum, gallium, indium, or thallium. In some embodiments, said dopant includes phosphorus, arsenic, antimony, bismuth, selenium, or tellurium. In some embodiments, said cap material includes aluminum nitride, beryllium oxide, tungsten, copper, or nickel. In some embodiments, said cap material includes an alloy of nickel, iron, and cobalt.

Additional features and embodiments of the present general inventive concept will be set forth in part in the description which follows and, in part, will be obvious from the description, or may be learned by practice of the present general inventive concept.

BRIEF DESCRIPTION OF THE DRAWINGS

The following example embodiments are representative of example techniques and structures designed to carry out the features of the present general inventive concept, but the present general inventive concept is not limited to these example embodiments. Moreover, in the accompanying drawings and illustrations, the sizes and relative sizes, shapes, and qualities of lines, entities, and regions may be exaggerated for clarity. A wide variety of additional embodiments will be more readily understood and appreciated through the following detailed description of the example embodiments, with reference to the accompanying drawings in which.

DETAILED DESCRIPTION

Figure 1:
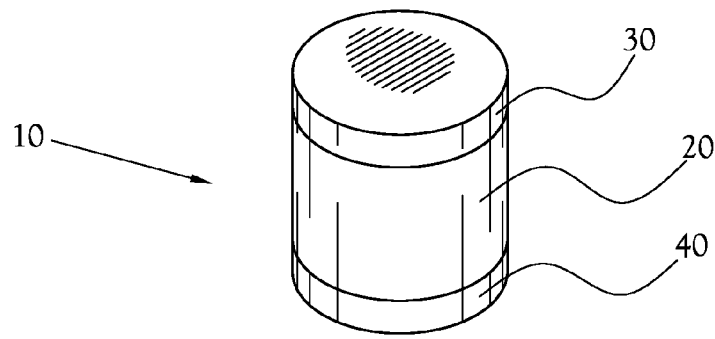
FIG. 1 is a perspective view of a pellet according to one example embodiment of the present general inventive concept.

Reference will now be made to example embodiments of the present general inventive concept, examples of which are illustrated in the accompanying drawings and illustrations. The example embodiments are described herein in order to explain the present general inventive concept by referring to the figures.

Disclosed herein are various embodiments of a thermoelectric semiconducting assembly. In some example embodiments, two parallel plates, a first plate and a second plate, are spaced apart. A plurality of pellets are fitted into said first plate and into said second plate, each said pellet comprising a body, a first cap, and a second cap, said body including a silicon material, said first cap and said second cap including an electrically resistive ceramic material, each pellet in said second plate being connected to a pellet in said first plate. (A preferred geometry of the pellet is a round cylinder so to miminize thermo-mechanical stresses.) Each pellet includes a doped body, wherein half of said pellets are doped with a p-type dopant to form a p-type pellet and half of said pellets are doped with an n-type dopant to form an n-type pellet. Each plate includes p-type pellets and n-type pellets in an alternating pattern, and each p-type pellet in said first plate connects with an n-type pellet in said second plate, and wherein each n-type pellet in said first plate connects with a p-type pellet in said second plate.

In some example embodiments of the present general inventive concept, a thermoelectric semiconducting assembly for use in generating electricity from waste heat in industrial and other settings, as well as thermoelectric coolers, comprises a first plate and a second plate, said first plate and said second plate being parallel and being spaced apart, said plates being fabricated from an electrically insulating material; a plurality of semiconductor components fitted into said first plate, said semiconductor components including a material including silicon; and a plurality of semiconductor components fitted into said second plate, said semiconductor components including a material including silicon, each said semiconductor component in said second plate being connected to a semiconductor component in said first plate. In many embodiments, each semiconductor component includes a doped body; half of said semiconductor components are doped with a p-type dopant to form a p-type constituent, and half of said semiconductor components are doped with an n-type dopant to form an n-type constituent. Said first plate includes p-type constituents and n-type constituents in an alternating pattern, and similarly said second plate includes p-type constituents and n-type constituents in an alternating pattern; each p-type constituent in said first plate connects with an n-type constituent in said second plate, and each n-type constituent in said first plate connects with a p-type constituent in said second plate. In some embodiments, a p-type dopant includes boron, aluminum, gallium, indium, or thallium. In some embodiments, an n-type dopant includes phosphorus, arsenic, antimony, bismuth, selenium, or tellurium. In some specific example embodiments, the p-type dopant includes boron and the n-type dopant includes phosphorus.

In some example embodiments of the present general inventive concept, a thermoelectric semiconducting assembly comprises a first plate and a second plate, said first plate and said second plate being parallel and being spaced apart, said first plate having an exterior surface and an interior surface, said second plate having an exterior surface and an interior surface, said interior surface of said first plate facing said interior surface of said second plate, said plates being fabricated from a glass material; a plurality of pellets fitted into said first plate, each said pellet comprising a body, a first cap, and a second cap, said body including a silicon material, said first cap and said second cap including an electrically resistive ceramic material, said pellets fitted into said first plate such that said first cap of said pellet is oriented toward said exterior surface of said first plate and said second cap of said pellet is oriented toward said interior surface of said first plate and protrudes from said interior surface of said first plate; and a plurality of pellets fitted into said second plate, each said pellet comprising a body, a first cap, and a second cap, said body including a silicon material, said first cap and said second cap including an electrically resistive ceramic material, said pellets fitted into said second plate such that said first cap of said pellet is oriented toward said exterior surface of said second plate and said second cap of said pellet is oriented toward said interior surface of said second plate and protrudes from said interior surface of said second plate, each said pellet in said second plate being connected to a pellet in said first plate. In some embodiments, said first plate and said second plate include borosilicate glass.

In many embodiments, each pellet includes a doped body, wherein half of said pellets are doped with a p-type dopant to form a p-type pellet and half of said pellets are doped with an n-type dopant to form an n-type pellet, wherein within said first plate includes p-type pellets and n-type pellets in an alternating pattern, wherein within said second plate includes p-type pellets and n-type pellets in an alternating pattern, wherein each p-type pellet in said first plate connects with an n-type pellet in said second plate, and wherein each n-type pellet in said first plate connects with a p-type pellet in said second plate. In some embodiments, said p-type dopant includes boron, aluminum, gallium, indium, or thallium. In some embodiments, said n-type dopant includes phosphorus, arsenic, antimony, bismuth, selenium, or tellurium. Arsenic has a history in commercial doping semiconductors and is a larger atom than phosphorous and is thus less mobile in the silicon lattice and less prone to diffusion physics and able to operate stably at higher temperatures for much longer periods of service. In some specific example embodiments, said p-type dopant includes boron and said n-type dopant includes arsenic.

As explained, each said pellet comprising a body, a first cap, and a second cap. Generally, but not always, the first cap and the second cap are made from similar materials or the same material (hereinafter "cap material"). In some embodiments, the cap material includes aluminum nitride or beryllium oxide. In some embodiments, the cap material includes a material formed by pressing powderized tungsten, sintering the pressed tungsten into a porous tungsten product with a natural density of about 70%, and then infiltrating the porous tungsten product with copper. In some embodiments, the cap material includes nickel. In some embodiments, the cap material includes an alloy of nickel, iron, and cobalt.

In various embodiments, the pellets are secured or fitted within the first plate and the second plate through various methods and materials. In some embodiments, pellets are fitted into said first plate and said second plate by brazing. In some embodiments, pellets are fitted into said first plate and said second plate by soldering. In some embodiments, pellets are fitted into said first plate and said second plate with glass fritting. In some embodiments, pellets are fitted into said first plate and said second plate by mechanical means.

Some example embodiments of the present general inventive concept comprise a pellet for use in a thermoelectric material. In several example embodiments, this pellet comprises a body including a silicon material, said body defining at least two opposing sides; and a cap material including an electrically resistive material. The pellet includes two caps fabricated from said cap material, each said cap connected to said body on one of said two opposing sides of said body.

In several example embodiments, the pellet is doped with a doping material. In some embodiments, said dopant includes boron, aluminum, gallium, indium, or thallium. In some embodiments, said dopant includes phosphorus, arsenic, antimony, bismuth, selenium, or tellurium.

In various embodiments, said cap material includes aluminum nitride, beryllium oxide, tungsten, copper, or nickel. In some embodiments, said cap material includes an alloy of nickel, iron, and cobalt.

Turning to the example embodiments of the present general inventive concept illustrated generally in the figures, FIG. 1 shows one example embodiment of a pellet 10. The pellet 10 includes a body 20, a first cap 30, and a second cap 40. Generally, the body 20 comprises a porous structure of milled silicon or a mixture including silicon. Generally, but not always, the first cap 30 and the second cap 40 are made from the same cap material. In some embodiments, the cap material includes aluminum nitride or beryllium oxide. In some embodiments, the cap material includes powderized tungsten milled with copper. In some embodiments, the cap material includes nickel. In some embodiments, the cap material includes an alloy of nickel, iron, and cobalt.

Figure 2:
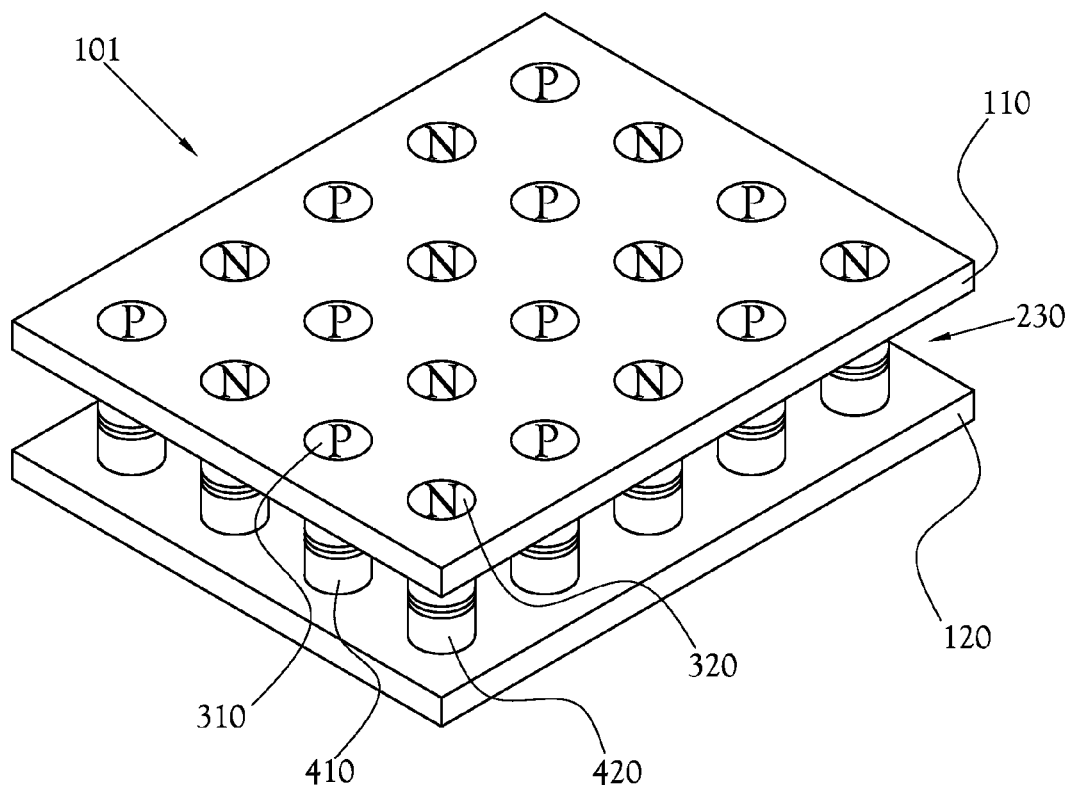
FIG. 2 is a perspective view of an assembly according to an example embodiment of the present general inventive concept.

FIG. 2 illustrates one example embodiment of the present general inventive concept, showing an assembly 101 comprising two parallel plates 110 and 120 with a plurality of pellets. As shown in FIG. 2, a plurality of pellets are fitted into the first plate 110; approximately half of the pellets fitted into the first plate 110 are doped with n-type dopants to constitute n-type semiconductor pellets (of "n-type pellets"), and approximately half of the pellets fitted into the first plate 110 are doped with p-type dopants to constitute p-type semiconductor pellets (of "p-type pellets"). The pellets are arranged within the first plate 110 in an array such that p-type pellets and n-type pellets alternate in each row. As shown in FIG. 2, the first plate 110 and the second plate 120, in their parallel arrangement, define an interior volume 230.

Figure 3:
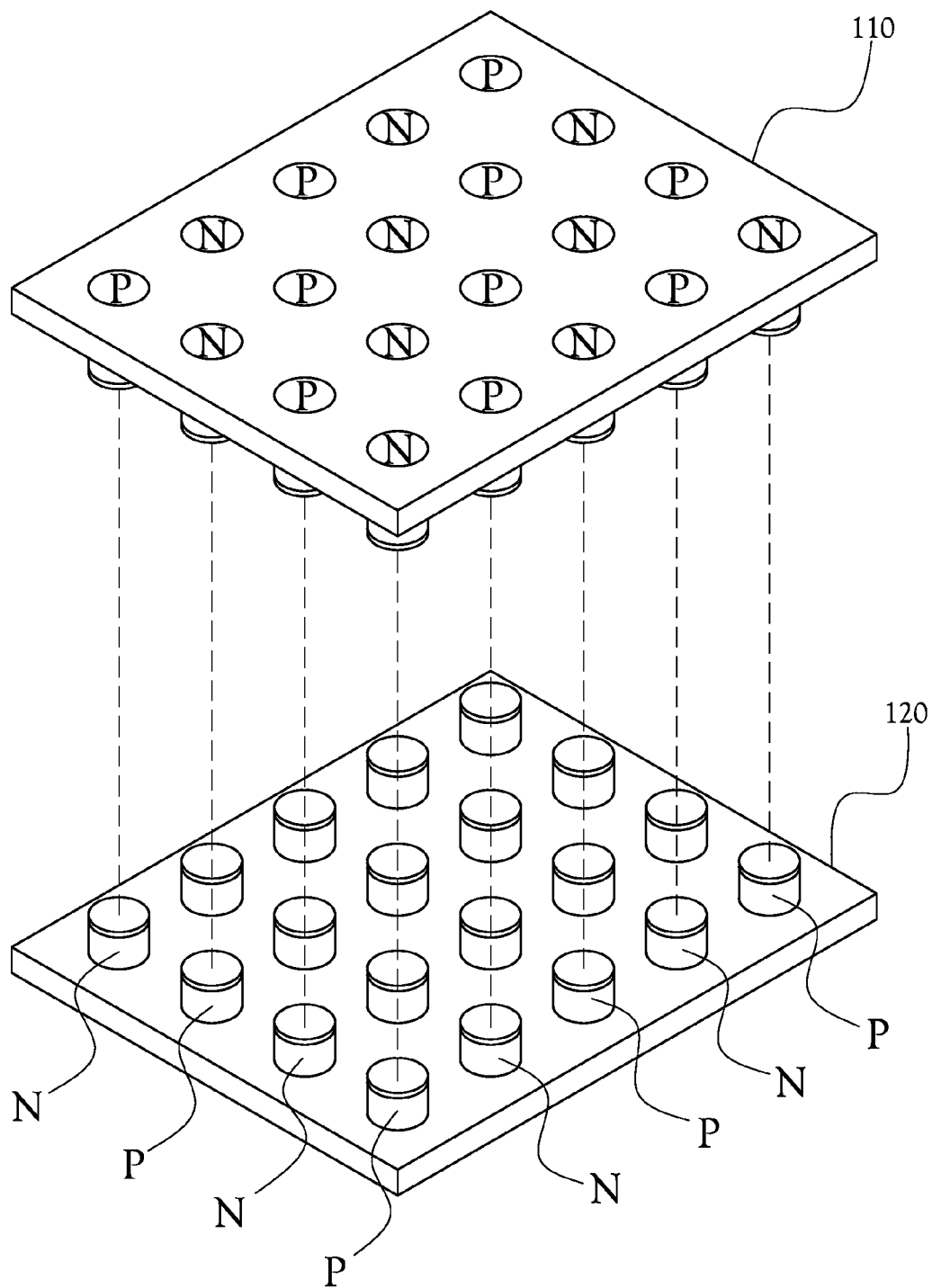
FIG. 3 is an exploded view of the example assembly shown in FIG. 2.
Figure 4:
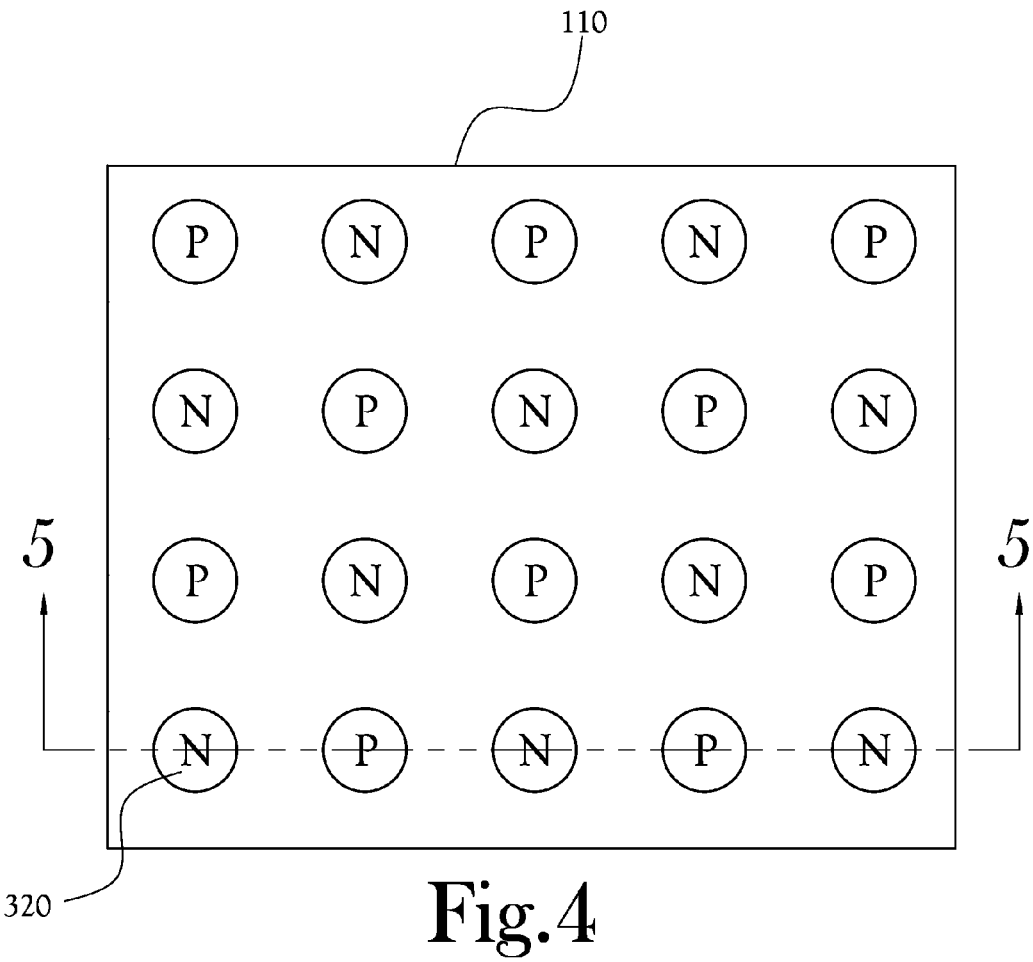
FIG. 4 is a top-down view of the example assembly shown in FIGS. 2 and 3.
Figure 5:
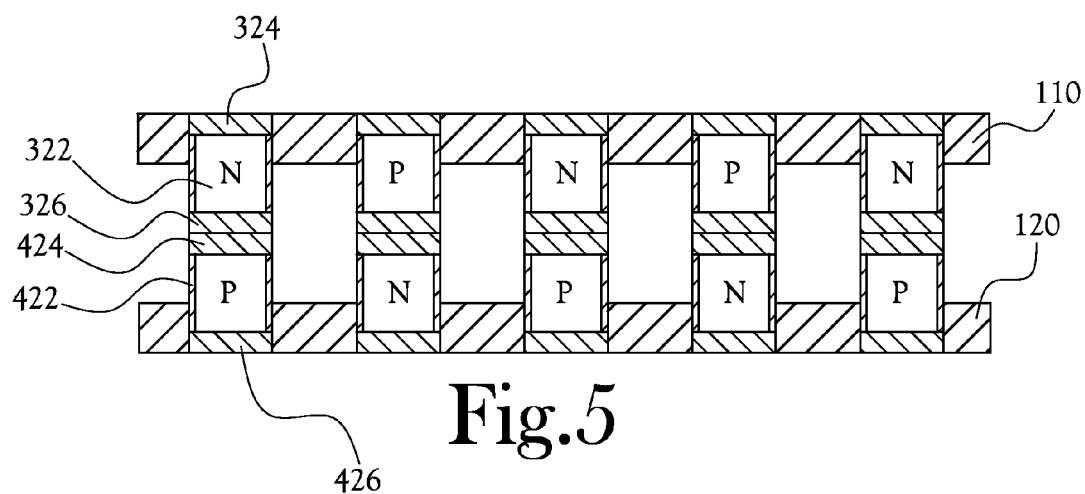
FIG. 5 is section view of the example assembly shown in FIGS. 2, 3 and 4, showing a section view of the example assembly taken along the section line shown in FIG. 4.

FIGS. 3, 4, and 5 illustrate different views of the same assembly shown in FIG. 2. FIG. 3 is an exploded view of the example assembly shown in FIG. 2; FIG. 4 is a top-down view of the same example assembly, showing the section line along which the view in FIG. 5 is taken; and FIG. 5 is section view of the same example assembly, showing a section view of the example assembly taken along the section line shown in FIG. 4.

As shown in FIG. 2 and in the exploded view in FIG. 3, each pellet fitted into the first plate 110 is matched with and connected to a corresponding pellet fitted into the second plate 120. As shown in FIG. 3 and in the section view in FIG. 5, each p-type pellet fitted into the first plate 110 is matched with and connected to an n-type pellet fitted into the second plate 120. Likewise, each n-type pellet fitted into the first plate 110 is matched with and connected to a p-type pellet fitted into the second plate 120. Thus, for example, in FIG. 2, one example p-type pellet 310 in the first plate 110 is connected to a corresponding example n-type pellet 410 in the second plate 120, and one example n-type pellet 320 in the first plate 110 is connected to a corresponding example p-type pellet 420 in the second plate 120.

In the illustrated example embodiment shown generally in FIGS. 2-5, each pellet includes a body, a first cap, and a second cap. Generally, the body comprises a porous structure of milled silicon or a mixture including silicon. However, a silicon-based material is generally not suited for interfacing directly with temperature extremes. Thus, the pellet has an interface with the outside world—the caps. In some example embodiments, such an interface includes a ceramic material with very high thermal conductivity and a CTE matched with silicon and good electrical resistivity. As shown in the section view in FIG. 5, the example n-type pellet 320 fitted into the first plate 110 includes a body 322, a first cap 324 oriented toward the exterior surface of the first plate 110, and a second cap 326, which is oriented toward the interior surface of the first plate 110 and protrudes into the interior space between the first plate 110 and the second plate 120. The corresponding example p-type pellet 420 fitted into the second plate 120 includes a body 422, a first cap 424 oriented toward the interior surface of the second plate 120 and protruding into the interior space between the first plate 110 and the second plate 120, and a second cap 426 oriented toward the exterior surface of the second plate 120. The second cap 326 of the n-type pellet 320 and the first cap 424 of the p-type pellet 420 connect to form a P/N junction.

In various embodiments, the pellets are secured or fitted within the first plate and the second plate through various methods and materials. In some embodiments, pellets are fitted into said first plate and said second plate by brazing. In some embodiments, pellets are fitted into said first plate and said second plate by soldering. In some embodiments, pellets are fitted into said first plate and said second plate with glass fritting. In some embodiments, pellets are fitted into said first plate and said second plate by mechanical means. Further, in some embodiments, the means used to fit pellets into the first plate 110 are different from the means used to fit pellets into the second plate 120.

Additionally, in some embodiments, the plates 110 and 120 are fabricated from the same material. In other embodiments, the first plate 110 is fabricated from a different material than the second plate 120. In some embodiments, one or both plates are fabricated from a metal material. In some embodiments, one or both plates are fabricated from a ceramic material. In some embodiments, one or both plates are fabricated from a glass material. In some embodiments, one or both plates are fabricated from a boro-silicate glass.

Although in the illustrated example embodiments shown in the Figures the semiconductor components of the assembly are pellets, it is to be understood that the semiconductor components of thermoelectric assemblies according to the present general inventive concept, in various embodiments, comprise other forms, and the present general inventive concept is not limited to pellets.

Also disclosed and described herein are novel methods and assemblies to package a thermoelectric subcomponent fabricated from silicon in a porous structure, preferably as a pellet so the minimize thermal mechanical stresses in the pellet structure, made in such a way to maximize thermal conductivity into and out of the opposite ends of the pellet so to maximize the thermal gradient, and optimize those materials properties that maximize the power factor calculated from the Seebeck Coefficient. While we are obtaining very attractive Seebeck Coefficients, but particularly low thermal conductivity and high electrical conductivity, and other properties, actually harvesting the maximum potential of these devices requires packaging that maximizing high delta T also provides environmental and electrical protection.

Further disclosed is a sub-assembly wherein a material matching or nearly matching the CTE of silicon but having very high thermal conductivity and high temperature and harsh environment resistance is fixed permanently to either side of our pellet. We chose the shape of the pellet to minimize thermo mechanical stresses in the pellet while sustaining very high delta Ts across its cross section. This sub-assembly is then fit into parallel plates by, for example, brazing or fitting into place with glass frits, so as to provide thermal and electrical isolation and connectivity as required managing maximum hot side/cold side thermal differences.

Example embodiments of the present general inventive concept are flexible in design and manufacture to fit a wide range of applications, from low to high temperatures, and from generating voltage from heat to generating cold surfaces using voltage.

In some embodiments, a silicon structure is pressed from finely divided silicon powder milled, for example, per methods disclosed in U.S. Pat. No. 6,638,491, issued to Carberry. The silicon structure is then typically pressed into the shape of a pellet; in some example embodiments, this pellet comprises a cylinder approximately 25 mm in diameter and 25 high. The pellet is then fired to structural strength at a temperature below silicon's melting point; in some embodiments, the firing temperature is approximately 1370 degrees Celsius.

A pellet fabricated as described is capable of being fabricated from substantially pure silicon and doped precisely with n-type dopants or p-type dopants to make n-type semiconductors and p-type semiconductors.

In some example embodiments, pellets and similar semiconductor components, constituents, and sub-assemblies demonstrate thermal conductivity measurements significantly lower than silicon's thermal conductivity when fully dense, which is about 149 W/M*K as follows: 9 watts at room temp, 7 watts at 50 degrees C., and 3 watts at 500 degrees C. Given successfully achieved electrical resistivity and semiconductor doping precision, it is possible to achieve Seebeck Coefficients of 480 and higher, with the ability to sustain delta T as high as 1100 degrees C. Since the power factor relates to the delta T and the Seebeck coefficients to a large degree, and electrical resistivity and thermal conductivity also, these achievements point towards the ability to make thermal electric generators capable of economic recovery of waste heat and superior chillers using said thermo electric devices.

It is possible to handle very pure silicon, as much as 9 nines pure, and dope it with n-type dopants and p-type dopants such that the purity of the silicon is preserved and the required precision of the doping is achieved in the range of one part to the 15th to 19th powers depending upon the type of dopant used. This process creates a method of obtaining the appropriate powders for pressing and sintering into the desired pellet having the desired Seebeck properties, being: (1) a Seebeck Coefficient of 200-1000; (2) electrical resistivity in the range of 1-5 m-ohms/cm; (3) thermal Conductivity in the range of 0.4-9 W/M*k; (4) low CTE in the range of 3-5 ppm; (5) strong materials properties; and (6) high Delta T capability from a materials and thermo mechanical point of view.

Having obtained these properties in an economical subcomponent structure, the challenge is to design and make packaging in such a way that an economical package can achieve and sustain the required delta T for waste heat recovery, or electrically create a large delta T in the case of the chiller. The challenges in such a case include, in the case of waste heat recovery for voltage, that the temperature range and delta of greatest interest is in the range of 200 to 900 degrees Celsius.

In example embodiments according to the present general inventive concept, it is possible to make both n-type and p-type pellets and to alternate them. In these embodiments, it is necessary to electrically isolate the pellets and alternate them in the packaging design, such that each p-type constituent on top connects with an n-type constituent on bottom, and each n-type constituent on top connects with a p-type constituent on bottom.

Porous silicon pellets are engineered to have low thermal conductivity, to have very high electrical conductivity, and to maximize the Seebeck Coefficient, but an assembly according to the present general inventive concept requires high efficiency at moving heat into the silicon on the hot side and moving heat out of it on the cold side. Therefore, what is required is a high thermal conductivity interface on both sides. Additionally, a porous silicon structure generally will not be sufficiently robust to withstand the trauma of being exposed to large bypass of exhaust and fanning in the ambient world so we need to protect it in being so exposed. Therefore, silicon-based pellets are packaged such that there is maximum thermal insulation between the hot side and cold side; generally, air or vacuum between plates is employed.

Materials selection for packaging requires specific requirements such as: low or matched CTE with regard to silicon; low CTE and high thermal conductivity; low CTE and electrical insulation along with high temp operating capability; an ability to "frit" parts into place and operate at up to 600 degrees C. or higher; and an ability to maximize temp on our hot side in the silicon and minimize temp on our cold side. Additionally, it is desirable to have a package that is capable of being mass-produced at low cost from commonly or economically available materials in modules that can be adapted to a wide variety of applications including refrigeration, waste heat recovery in automotive exhaust, waste heat recovery in industrial waste heat environments and many others.

A pellet needs an interface with the outside world which can be robustly joined, not cause thermo mechanical stresses in such joining, conduct heat very well and be strong to withstand traumas presented by the outside world while being able to be joined with appropriate packaging elements.

In some example embodiments, such an interface includes a ceramic material with very high thermal conductivity and a CTE matched with silicon and good electrical resistivity. Beryllium oxide (BeO) and aluminum nitride (AlN) are excellent candidates, especially AlN since it's CTE matches silicon very closely. AlN can be metalized and brazed or soldered to silicon and is strong with regard to interfacing with the outside world; SiC has attractive thermal conductivity (120 W/M*k and low CTE at 4 ppm), but is a semiconductor. In some embodiments, aluminum nitride or another suitable ceramic is metalized and braised or soldered to either side of a silicon pellet.

However, AlN is not economically available at this time, and BeO is both expensive and toxic, so there is really no currently viable ceramic solution, so electrical isolation may need to be achieved by other means. In such a case there are some very attractive metal-based solutions, for instance elkonite materials. These materials are made by pressing tungsten powders into porous shapes of various densities and filling the interstices with copper. The resultant structures can have very high thermal conductivity with very controlled CTEs. For instance commercially available shapes in can have a CTE as low as 5.7 ppm and thermal conductivity as high as 190 W/M*k. They are very strong and are electrical conductors, but with the nearly matched CTE to silicon and the exceptional thermal conductivity they serve well to protect the silicon from the outside world while serving in a very superior function to move heat into the hot side and out of the cold side. Different models inform design decisions as to the amount of elkonite desired on each side in terms of heat capacity and transfer.

Materials such as Kovar, which is based on nickel iron cobalt alloys offer a low CTE and have a thermal conductivity of about 18 W/M*k, and are easily formed into some shapes and are candidates for some elements as well.

In such a way, if the Kovar or Elkonite are nickel plated for instance, materials such as the silver copper eutectic (72% silver, 28% copper, melting point 778 degrees c) can be used to reliably join discs of these materials to the upper and lower face of the pellet.

In some example embodiments, leads are held in place and brazed into place such that the pellets all have leads connecting to the silicon from the sides that are brazed to the protection/thermal transfer faces thus fixed into place.

However they can also be fritted into place using glass frits. These can be selected to match or bridge the difference in the CTE of the materials of construction as well as to operate in the desired temperature ranges.

In example embodiments in which elkonite is used, this material is typically pressed into shape and the sintered to consolidate the porosity. In doing so we have several options for creating superior surfaces and areas for heat exchange. For instance we can press ridges onto the surface to substantially increase the surface area exposed to both the hot and cold side flow of gas. We can also attach extruded aluminum shapes with brazing and solders, in some cases during the same process when we attach the elkonite to the porous silicon pellet. Such incorporation of highly effective and efficient heat exchange elements and geometry can be exceptionally helpful to getting the heat into the hot side, and maintaining a very high delta T on the cold side.

In the case of very-high-temperature applications, the sub-assembly can be permanently fitted into a parallel assembly plates with a glass frit having good electrical resistance at operating temperatures, (for instance in the range of 2 k ohms/cm). Schott for instance offer such frits for Solid Oxide Fuel Cell assemblies in the system [Mg, Ca]O—$Al_2O_3$—BaO—$SiO_2$—$B_2O_3$. Due to harsh conditions that are expected for the operating conditions of the thermoelectric modules, such as high operating temperatures (about 450° C. to 650° C.) and aggressive environments with regard to exhaust and emissions in auto and industrial waste heat, these frits serve to give long life with good electrical isolation and mechanical strength.

In many embodiments, two parallel plates each include holes in an array so to be able to frit pellets or other sub-assemblies into the two plates and have the silicon in the middle only exposed to air or vacuum, such that there is good electrical and thermal isolation in the pellet from one side to the other.

In some cases at lower temperatures these plates can be constructed of metals or even composites. At higher temperatures some metals will serve well letting a good-sized frit ring provide the electrical isolation, but in others chemical and thermal conditions may mandate the use of glass, such as glass ceramics as are available from the LAS system, and also borosilicate glasses which both have low CTE.

As the pellet assembly has leads fixed into place, these can be connected to make a series of P/N junctions collecting the voltage generated by assembly. The finishing of the assembly includes sealing the perimeter and, in some embodiments, assuring a flow of air through the interplanar volume, as well and assuring that the hot side is isolated from these contained spaces and there is a flow of cold air over the cold side, thus isolated the cold side from the hot side and assuring a maximizing of the delta T between the cold side and the hot side. Thus, the only significant heat sink or materials available to conduct heat from one side to the other are interplanar air and the silicon of the pellets or sub-assemblies.

In some embodiments, it is useful that the hot side chambers and passages and the cold side chambers and passages be isolated from each other, allowing each to have maximum effect heating the hot side surface of the assembly and cooling the cold side surface of the assembly. It is expected that heat flow will handle gas and air flow on the hot side, but that some fin or other heat sink transfer element is used to collect the heat into the hot side surface of the assembly. It is expected that on the cold side, fins or thermal transfer elements and heat sinks can be employed and that forced cold air passage can also be used to great advantage. In the case of a vehicle, the moving air under and around the vehicle can offer a way of channeling cold air through this area and on these surfaces. In other embodiments, a fan is employed. For example, in the case of a high efficiency chiller, a small fan over the cold side heat sink assures that while one had an attractive delta T on the charged hot side, the heat is not traveling in the wrong direction.

It will be recognized to one skilled in the art that thermoelectric generator elements such as these sub-assemblies will be used for a wide variety of applications, for instance recovering waste heat in a variety of environments and temperatures as well as generating heat removal for cooling or freezing or refrigerating. In many embodiments, p-type and n-type sub-assemblies are assembled in series as densely as possible.

In some embodiments, only one sheet of planer materials elements is used, potted around an elkonite-type material on the hot side. In this event, the cold air can be flowed over the entire assembly of porous silicon and elkonite on the cold side assuring an optimal delta T.

Also, in some embodiments, two planer materials elements are used and cold air is flowed through the interstices as well as the outside of the cold side, where cold side elkonite-type materials are employed.

In several embodiments, sub-assemblies and assemblies can be constructed in such a way to optimize the delta T, recognizing that a discrete amount of voltage is generated for each degree delta T.

It is noted that the following detailed description may recite various descriptive terms such as horizontal, vertical, top, bottom, upward, downward, left, right, etc., when referring to the exemplary figures, but the present general inventive concept is not limited to any such terms or physical orientations. Such terms are used for convenience of description only, and could be reversed, modified, or interchanged without departing from the broader scope and spirit of the present general inventive concept.

It is noted that the simplified diagrams and drawings do not illustrate all the various connections and assemblies of the various components, however, those skilled in the art will understand how to implement such connections and assemblies, based on the illustrated components, figures, and descriptions provided herein.

It is also noted that numerous variations, modifications, and additional embodiments are possible, and accordingly, all such variations, modifications, and embodiments are to be regarded as being within the spirit and scope of the present general inventive concept. For example, regardless of the content of any portion of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Accordingly, while the present general inventive concept has been illustrated by description of several example embodiments, it is not the intention of the applicant to restrict or in any way limit the scope of the inventive concept to such descriptions and illustrations. Instead, the descriptions, drawings, and claims herein are to be regarded as illustrative in nature, and not as restrictive, and additional embodiments will readily appear to those skilled in the art upon reading the above description and drawings.

The invention claimed is:

1. A thermoelectric semiconducting assembly comprising:
a first plate and a second plate, said first plate and said second plate being parallel and being spaced apart, said first plate having an exterior surface and an interior surface, said second plate having an exterior surface and an interior surface, said interior surface of said first plate facing said interior surface of said second plate, said plates being fabricated from a glass material;
a plurality of pellets fitted into said first plate, each said pellet comprising a body, a first cap, and a second cap, said body including a silicon material, said first cap and said second cap being fabricated from a different material than said first and second plate, said pellets fitted into said first plate such that said first cap of said pellet is oriented toward said exterior surface of said first plate and said second cap of said pellet is oriented toward said interior surface of said first plate and protrudes from said interior surface of said first plate; and a plurality of pellets fitted into said second plate, each said pellet comprising a body, a first cap, and a second cap, said body including a silicon material, said first cap and said second cap being fabricated from a different material than said first and second plate, said pellets fitted into said second plate such that said first cap of said pellet is oriented toward said exterior surface of said second plate and said second cap of said pellet is oriented toward said interior surface of said second plate and protrudes from said interior surface of said second plate, each said pellet in said second plate being connected to a pellet in said first plate.

2. The thermoelectric semiconducting assembly of claim 1 wherein each pellet includes a doped body, wherein half of said pellets are doped with a p-type dopant to form a p-type pellet and half of said pellets are doped with an n-type dopant to form an n-type pellet, wherein said first plate includes p-type pellets and n-type pellets in an alternating pattern, wherein said second plate includes p-type pellets and n-type pellets in an alternating pattern, wherein each p-type pellet in said first plate connects with an n-type pellet in said second plate, and wherein each n-type pellet in said first plate connects with a p-type pellet in said second plate.

3. The thermoelectric semiconducting assembly of claim 1 wherein said p-type dopant includes boron, aluminum, gallium, indium, or thallium.

4. The thermoelectric semiconducting assembly of claim 1 wherein said n-type dopant includes phosphorus, arsenic, antimony, bismuth, selenium, or tellurium.

5. The thermoelectric semiconducting assembly of claim 1 wherein said p-type dopant includes boron and said n-type dopant includes arsenic.

6. A thermoelectric semiconducting assembly comprising:
a first plate and a second plate, said first plate and said second plate being parallel and being spaced apart, said first plate having an exterior surface and an interior surface, said second plate having an exterior surface and an interior surface, said interior surface of said first plate facing said interior surface of said second plate, said plates being fabricated from a glass material;
a plurality of pellets fitted into said first plate, each said pellet comprising a core, a first cap, and a second cap, said core including a silicon material, said first cap and said second cap including an electrically resistive ceramic material, said pellets fitted into said first plate such that said first cap of said pellet is oriented toward said exterior surface of said first plate and said second cap of said pellet is oriented toward said interior surface of said first plate and protrudes from said interior surface of said first plate, wherein said first cap includes aluminum nitride or beryllium oxide; and
a plurality of pellets fitted into said second plate, each said pellet comprising a core, a first cap, and a second cap, said core including a silicon material, said first cap and said second cap including an electrically resistive ceramic material, said pellets fitted into said second plate such that said first cap of said pellet is oriented toward said exterior surface of said second plate and said second cap of said pellet is oriented toward said interior surface of said second plate and protrudes from said interior surface of said second plate, each said pellet in said second plate being connected to a pellet in said first plate, wherein said first cap includes aluminum nitride or beryllium oxide.

7. A thermoelectric semiconducting assembly comprising:
a first plate and a second plate, said first plate and said second plate being parallel and being spaced apart, said first plate having an exterior surface and an interior surface, said second plate having an exterior surface and an interior surface, said interior surface of said first plate facing said interior surface of said second plate, said plates being fabricated from a glass material;
a plurality of pellets fitted into said first plate, each said pellet comprising a core, a first cap, and a second cap, said core including a silicon material, said first cap and said second cap including an electrically resistive ceramic material, said pellets fitted into said first plate such that said first cap of said pellet is oriented toward said exterior surface of said first plate and said second cap of said pellet is oriented toward said interior surface of said first plate and protrudes from said interior surface of said first plate, wherein said first cap includes powderized tungsten infiltrated with copper; and
a plurality of pellets fitted into said second plate, each said pellet comprising a core, a first cap, and a second cap, said core including a silicon material, said first cap and said second cap including an electrically resistive ceramic material, said pellets fitted into said second plate such that said first cap of said pellet is oriented toward said exterior surface of said second plate and said second cap of said pellet is oriented toward said interior surface of said second plate and protrudes from said interior surface of said second plate, each said pellet in said second plate being connected to a pellet in said first plate, wherein said first cap includes powderized tungsten infiltrated with copper.

8. A thermoelectric semiconducting assembly comprising:
a first plate and a second plate, said first plate and said second plate being parallel and being spaced apart, said first plate having an exterior surface and an interior surface, said second plate having an exterior surface and an interior surface, said interior surface of said first plate facing said interior surface of said second plate, said plates being fabricated from a glass material;
a plurality of pellets fitted into said first plate, each said pellet comprising a core, a first cap, and a second cap, said core including a silicon material, said first cap and said second cap including an electrically resistive ceramic material, said pellets fitted into said first plate such that said first cap of said pellet is oriented toward said exterior surface of said first plate and said second cap of said pellet is oriented toward said interior surface of said first plate and protrudes from said interior surface of said first plate, wherein said first cap includes nickel, and
a plurality of pellets fitted into said second plate, each said pellet comprising a core, a first cap, and a second cap, said core including a silicon material, said first cap and said second cap including an electrically resistive ceramic material, said pellets fitted into said second plate such that said first cap of said pellet is oriented toward said exterior surface of said second plate and said second cap of said pellet is oriented toward said interior surface of said second plate and protrudes from said interior surface of said second plate, each said pellet in said second plate being connected to a pellet in said first plate, wherein said first cap includes nickel.

9. A thermoelectric semiconducting assembly comprising:
a first plate and a second plate, said first plate and said second plate being parallel and being spaced apart, said first plate having an exterior surface and an interior surface, said second plate having an exterior surface and an interior surface, said interior surface of said first plate facing said interior surface of said second plate, said plates being fabricated from a glass material;

a plurality of pellets fitted into said first plate, each said pellet comprising a core, a first cap, and a second cap, said core including a silicon material, said first cap and said second cap including an electrically resistive ceramic material, said pellets fitted into said first plate such that said first cap of said pellet is oriented toward said exterior surface of said first plate and said second cap of said pellet is oriented toward said interior surface of said first plate and protrudes from said interior surface of said first plate, wherein said first cap includes an alloy of nickel, iron, and cobalt; and a plurality of pellets fitted into said second plate, each said pellet comprising a core, a first cap, and a second cap, said core including a silicon material, said first cap and said second cap including an electrically resistive ceramic material, said pellets fitted into said second plate such that said first cap of said pellet is oriented toward said exterior surface of said second plate and said second cap of said pellet is oriented toward said interior surface of said second plate and protrudes from said interior surface of said second plate, each said pellet in said second plate being connected to a pellet in said first plate, wherein said first cap includes an alloy of nickel, iron, and cobalt.

10. The thermoelectric semiconducting assembly of claim 1 wherein said pellets are fitted into said first plate and said second plate by brazing.

11. The thermoelectric semiconducting assembly of claim 1 wherein said pellets are fitted into said first plate and said second plate by soldering.

12. The thermoelectric semiconducting assembly of claim 1 wherein said pellets are fitted into said first plate and said second plate with glass fritting.

13. The thermoelectric semiconducting assembly of claim 1 wherein said pellets are fitted into said first plate and said second plate by mechanical means.

14. The thermoelectric semiconducting assembly of claim 1 wherein said first plate and said second plate include boro-silicate glass.

15. The thermoelectric semiconducting assembly of claim 1 wherein each first cap of each pellet of each first plate is aligned with the exterior surface of the first plate.

16. The thermoelectric semiconducting assembly of claim 15 wherein each first cap of each pellet of each second plate is aligned with the exterior surface of the second plate.

* * * * *